United States Patent [19]

Pirich et al.

[11] Patent Number: 4,784,703
[45] Date of Patent: Nov. 15, 1988

[54] DIRECTIONAL SOLIDIFICATION AND DENSIFICATION OF PERMANENT MAGNETS HAVING SINGLE DOMAIN SIZE MNBI PARTICLES

[75] Inventors: Ronald G. Pirich, Woodbury; David J. Larson, Jr., Huntington Station, both of N.Y.

[73] Assignee: Grumman Aerospace Corporation, Bethpage, N.Y.

[21] Appl. No.: 23,967

[22] Filed: Mar. 9, 1987

Related U.S. Application Data

[63] Continuation of Ser. No. 768,725, Aug. 23, 1985, abandoned, which is a continuation-in-part of Ser. No. 526,802, Aug. 26, 1983, abandoned.

[51] Int. Cl.$^4$ .............................................. H01F 1/02
[52] U.S. Cl. ...................................... 148/101; 148/2; 148/3; 164/122.1; 164/122.2
[58] Field of Search ....................... 148/2, 3, 100, 101, 148/102, 103; 164/122.1, 122.2

[56] References Cited

U.S. PATENT DOCUMENTS

| | | | |
|---|---|---|---|
| 2,578,407 | 12/1951 | Ebeling | 148/103 |
| 2,579,679 | 11/1951 | Guilland | 148/103 |
| 2,804,415 | 8/1957 | Boothby et al. | 148/103 |
| 2,825,670 | 3/1958 | Adams et al. | 148/103 |
| 2,862,287 | 12/1958 | Koch et al. | 29/607 |
| 2,865,085 | 12/1958 | Cornish et al. | 148/103 |
| 3,085,036 | 4/1963 | Steinort | 148/121 |
| 3,132,022 | 5/1964 | Luborsky et al. | 428/606 |
| 3,175,901 | 3/1965 | Jesmont et al. | 420/80 |
| 3,219,495 | 11/1965 | Steinort | 148/101 |
| 3,236,700 | 2/1966 | Heimke et al. | 148/104 |
| 3,421,889 | 1/1969 | Ostertag | 420/435 |
| 3,432,369 | 3/1969 | Naastepad | 156/616 R |
| 3,539,383 | 11/1970 | Chen et al. | 148/101 |
| 3,545,525 | 12/1970 | Aldenkamp | 164/485 |
| 3,619,289 | 11/1971 | Chen et al. | 148/103 |

FOREIGN PATENT DOCUMENTS

| | | | |
|---|---|---|---|
| 486949 | 9/1952 | Canada | 148/103 |
| 1156240 | 10/1963 | Fed. Rep. of Germany | 148/101 |
| 98356 | 6/1961 | Netherlands | 148/100 |

OTHER PUBLICATIONS

Adams et al., "A New Permanent Magnet from Powdered Manganese Bismuthide," J. of Applied Physics, vol. 23, No. 11, Nov. 1962.

Shot'ts et al., "Anisotropy of Magnetic Properties in Powder Samples of MnBi Alloy," Report of the Acad. of Science USSR, 1954, vol. 95, No. 4, pp. 781-784.

R. G. Pirich et al., RE-602, SPAR VI Technical Report for Experiment 76-22. Directional Solidification of Magnetic Composites, NASA, 1981.

R. G. Pirich et al., Characterization of Gravitationally Induced Convection on Solidification of Bismuth-Manganese Eutectic, Jul., 1981 Amer. Conf. Crystal Growth.

P. G. Pirich, Directional Solidification of Magnetic Composites, presented at Fifth International Conf., Amer. Assoc. Crystal Growth, Jul., 1981.

R. G. Pirich et al., Ground Base and Sounding Rocket SPAR Experiments on the Magnetic and Microstructural Properties of Directionally Solidified Eutectic Bi/MnBi, 157th Electro-Chemical Society Mtg., May, 1980.

R. G. Pirich, Comparison of Properties of Directionally Solidified Magnetic Compound in Low-g and One g Environments, 23rd Intern'l. COSPAR Meeting, Jun. 1980.

Primary Examiner—John P. Sheehan
Attorney, Agent, or Firm—Richard G. Geib; Daniel Jay Tick; David Aker

[57] ABSTRACT

Directional solidification of Bi and Mn compositions to produce magnetic single domain size MnBi particles with aligned morphologies followed by post heat treating and densification.

5 Claims, 5 Drawing Sheets

AMPOULE DESIGN FOR DIRECTIONAL SOLIDIFICATION

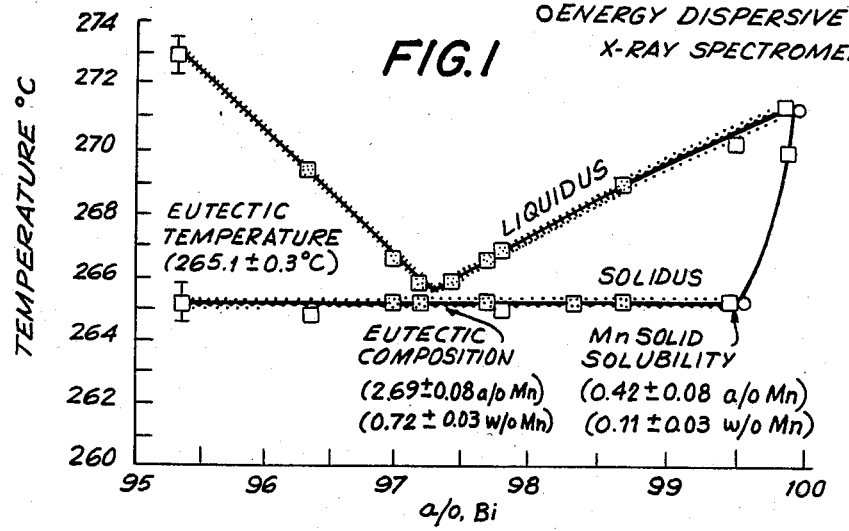
EQUILIBRIUM PHASE DIAGRAM IN THE VICINITY OF THE Bi/MnBi EUTECTIC
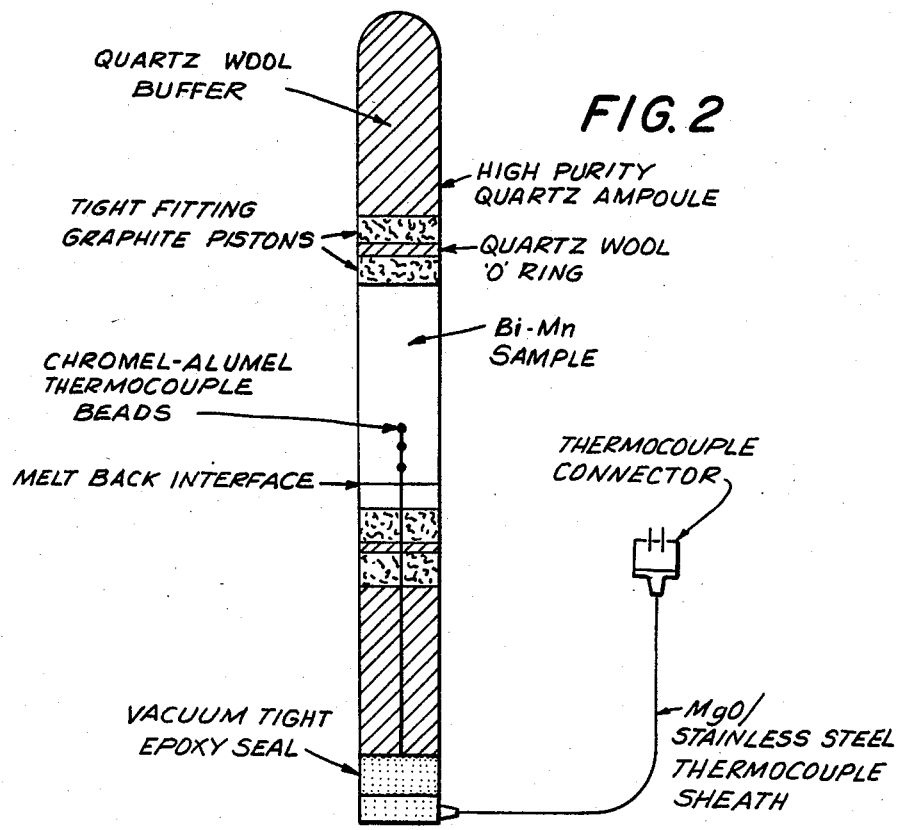
AMPOULE DESIGN FOR DIRECTIONAL SOLIDIFICATION

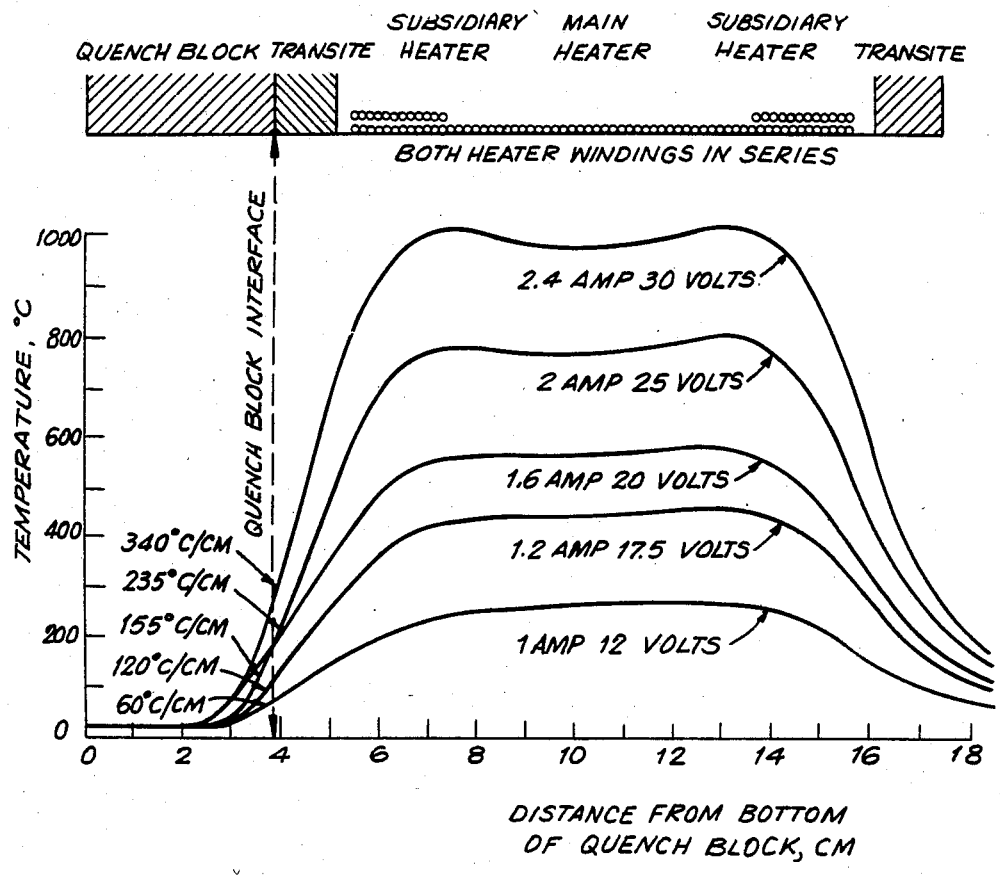
FIG. 3  TEMPERATURE PROFILES OBSERVED IN THE LABORATORY FURNACE
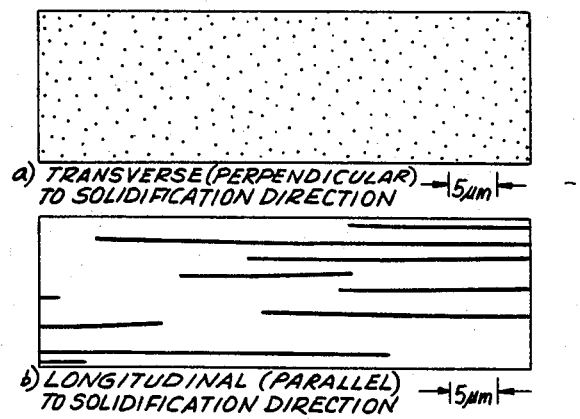
FIG. 4  EUTECTIC Bi-MnBi MORPHOLOGY PRODUCED BY DIRECTIONAL SOLIDIFICATION AT V=30 cm/h AND $G_L$=100°C/cm

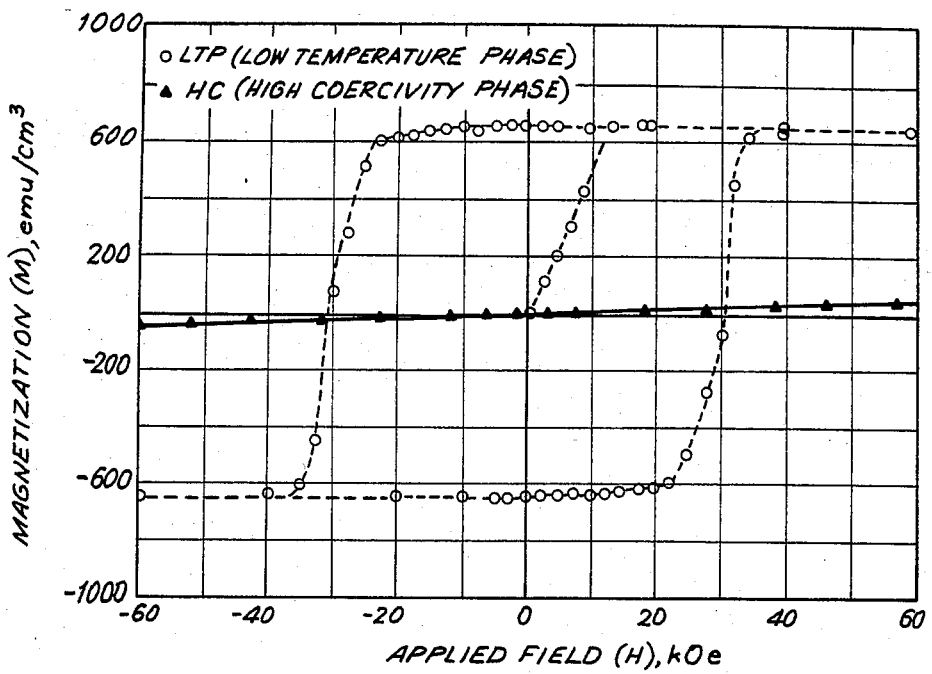
FIG. 6 MAGNETIZATION PER UNIT VOLUME OF DISPERSED MnBi AT 290 K PARALLEL TO SOLIDIFICATION DIRECTION FOR A SAMPLE WITH AVERAGE ROD DIAMETER $\langle d \rangle = 4\mu m$ IN THE AS-GROWN STATE (▲) CONTAINING >99 v/o HC PHASE AND FULLY ANNEALED (○) CONTAINING ONLY THE LTP MnBi PHASE
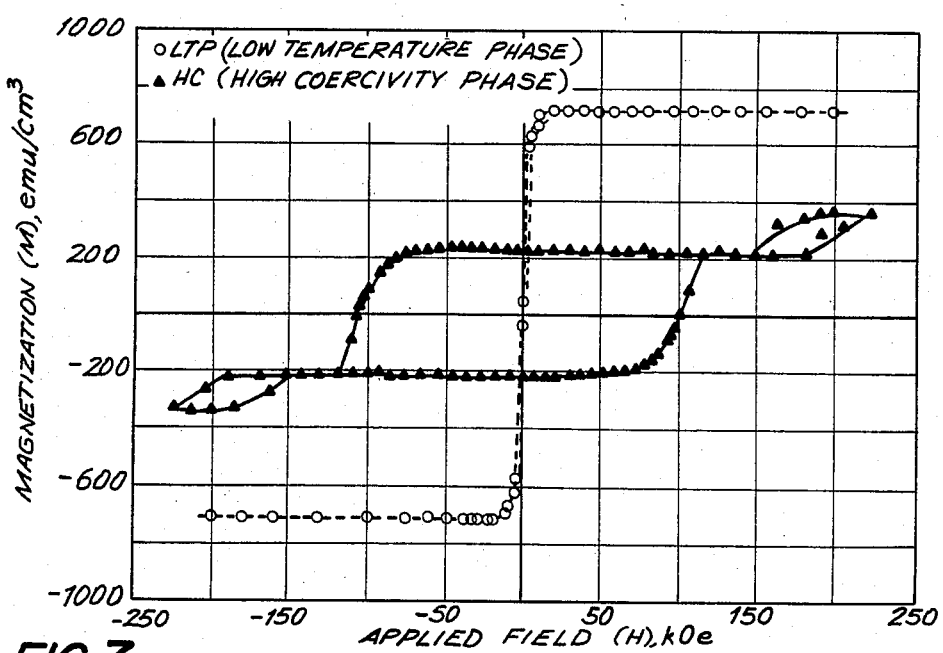
FIG. 7 HYSTERESIS CURVE AT 77K PARALLEL TO SOLIDIFICATION DIRECTION FOR SAMPLE DISPLAYED IN FIG. 4

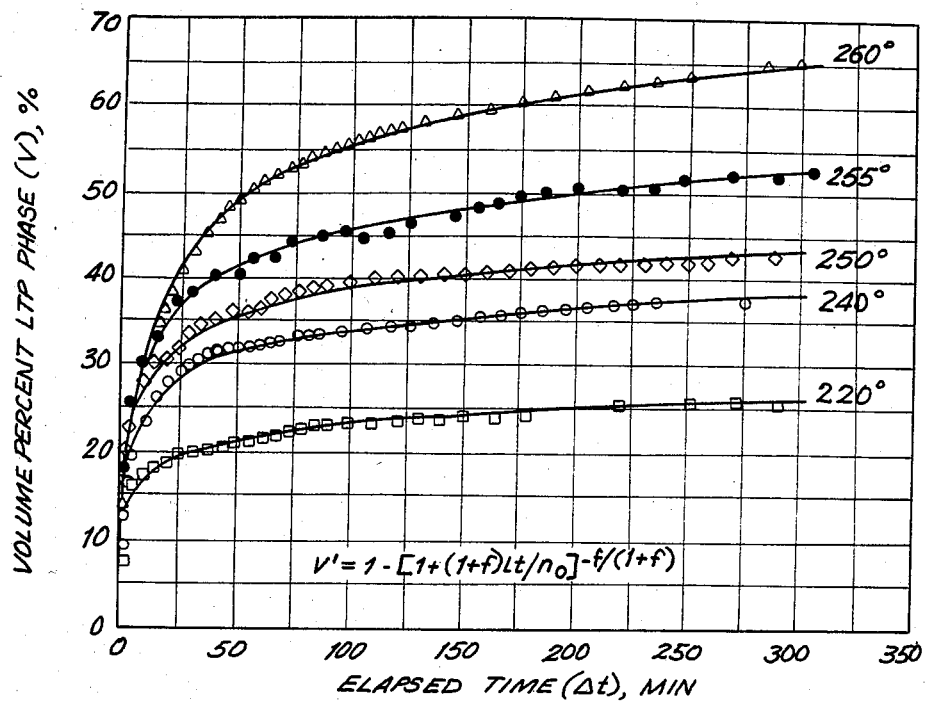
FIG. 8 ISOTHERMAL ANNEALING BEHAVIOR OF HC TO LTP MnBi PHASE TRANSFORMATION. SOLID LINES ARE THEORETICAL MODEL ASSUMING AN ISOTHERMAL MARTENSITIC TRANSFORMATION
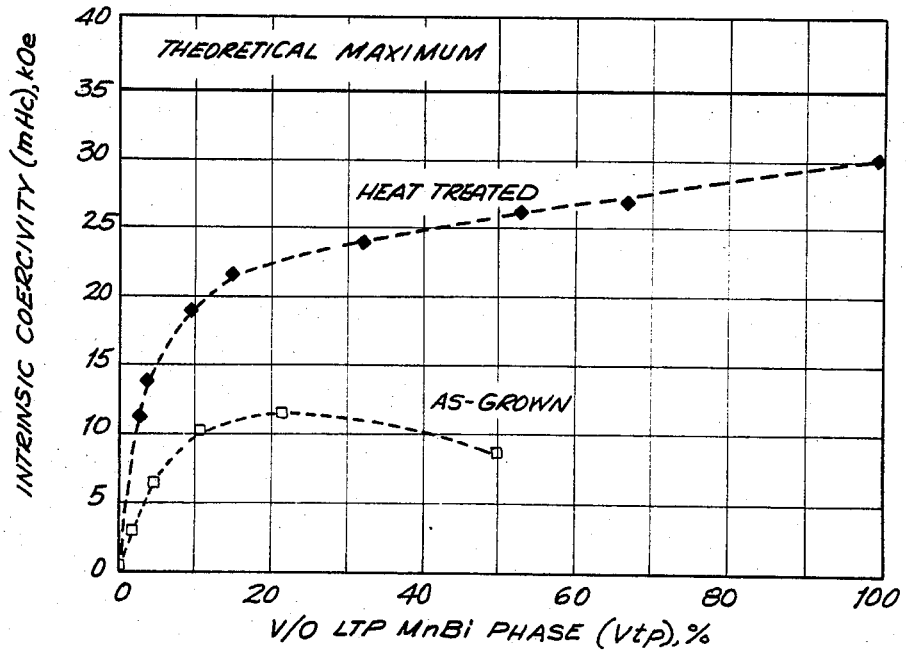
FIG. 9 LTP COMPONENT INTRINSIC COERCIVITY AS A FUNCTION OF v/o LTP PHASE PRODUCED BY DIRECTIONAL SOLIDIFICATION (□) & POST-SOLIDIFICATION HEAT-TREATMENT (♦)

DIRECTIONAL SOLIDIFICATION AND DENSIFICATION OF PERMANENT MAGNETS HAVING SINGLE DOMAIN SIZE MNBI PARTICLES

This application is a continuation of Ser. No. 768,725, filed on Aug. 23, 1985, now abandoned, which is a continuation-in-part of Ser. No. 526,802, filed on Aug. 26, 1983, now abandoned.

BACKGROUND OF THE INVENTION

This invention relates to the improved permanent magnet properties of ferromagnetic and ferrimagnetic MnBi, in the equilibrium, ferromagnetic phase (LTP) or non-equilibrium, ferrimagnetic phase (HC) produced in an aligned rod morphology directional solidification. Moreover, this invention relates to MnBi rods which contain a high coercivity or HC phase which provides exceptionally high permanent magnet properties at cryogenic temperature and can serve as a magnetic switch. The aforesaid high coercivity or HC phase is found to coexist with the LTP phase.

The novel produced MnBi rods of this invention serve as permanent magnet material for temperatures in the range of $-50°$ C.$-150°$ C. and at cryogenic temperature. These permanent magnet properties are comparable to presently used sintered rare earth-cobalt permanent magnets and can be mass produced at reduced costs.

The permanent magnet (ferromagnetic character of MnBi has long been established by a number of investigators. The MnBi intermetallic, which has a hexagonal NiAs crystal structure, possesses one of the highest magnetocrystalline anisotropies ($K_1 = 9.1 \times 10^6$ $erg/cm^3$, $K_2 = 2.6 \times 10^6$ $erg/cm^3$) and magnetostrictions ($\lambda_\perp = -800 \times 10^{-6}$) of any material other than the rare earth-cobalt alloys.

In order to optimize the permanent magnet figures of merit for this system, i.e., remanent induction, intrinsic coercivity and energy product: (1) the magnetic moment of each magnetic region or domain should be aligned with every other region such that each moment lies along the easy axis of magnetization and (2) the average domain size should be reduced below a critical size at which a single-domain structure is of lower energy (and hence more probable to exist) than a multi-domain structure and below which magnetization reversal by coherent rotation is favored over domain wall motion, reversed domain nucleation or incoherent curling processes.

However, the permanent magnet figures of merit may also be a sensitive function of the shape of the magnetic domain (shape anisotrophy), the elastic deformation of a domain under application of an external magnetic field (magnetostriction), local demagnetizing fields at surface irregularities or inclusions of the domains (strain), local elastic strains near dislocations and other lattice defects (magnetostriction, anti-ferromagnetic coupling, domain wall pinning), a local Bi-rich region produced by preferential oxidation of Mn (local reduction in magnetocrystalline anisotropy) or the coexistence of a second magnetic phase which could be ferromagnetic (magnetic coupling) or paramagnetic (ultra fine MnBi particles).

Previous attempts to produce single domain size, aligned permanent magnets using MnBi have involved hotpressing of ground powder in a very high external magnetic field which presumably aligns the easy axis of magnetization of different size and small MnBi particles (U.S. Pat. No. 2,825,670 to Adams et al). The coercive field for MnBi powder was found to be extremely sensitive to average particle size, varying from an intrinsic coercivity, $_mH_c$, of 600 Oe for 100 $\mu$m diameter particles to 12000 Oe for particles less than 3 $\mu$m in size (U.S. Pat. No. 2,579,679 to Guillaud). Unfortunately, due to the shape and deformation of the powder crystallites, permanent magnet properties achieved with MnBi powder are:

remanent induction (Br) = 4300 gauss
intrinsic coercivit ) ($_mH_c$) = 3400 Oe
maximum static energy product $(BH)_{max}$ = 4.3 MG-Oe at room temperature as compared with the theoretical maximum of:

Br = 8200 gauss
$_mH_c$ = 35000 Oe
$(BH)_{max}$ = 17 MG-Oe

We have used a different approach involving plane-front directional solidification to achieve aligned particles or rods of MnBi within a protective, non-ferromagnetic Bi matrix whose size is an order of magnitude less (<0.5 $\mu$m) than those obtained previously by grinding and crushing. This approach does not pertain to casting of nearly dense MnBi ingots (U.S. Pat. No. 2,804,415 to Boothby et al) to produce an ingot containing only the ferromagnetic (LTP) MnBi phase which by itself is not a suitable permanent magnet but requires additional processing such as grinding, sintering, etc. as outlined above

SUMMARY OF THE INVENTION

Accordingly, this invention involves a method for the directional solidification of various Bi and Mn compositions to produce magnetic single domain size MnBi particles, in aligned array, having a particle size of less than 1 micron and having an Mn concentration of up to 50 atomic percent which comprises directionally solidifying a composition containing Mn and Bi, said composition containing from 0.1 to 50% by atomic fraction Mn, at a solidifying rate of 0.5 cm/h to 100 cm/h and at a thermal gradient, in the liquid at the liquid-solid interface, of from 10° C./cm to 1000° C./cm.

In one embodiment of the above process, a magnetic single domain size MnBi particle composite is obtained which contains about 0.72% by weight Mn (the eutectic Bi-MnBi) which employs a solidifying rate of 30 cm/h at a thermal gradient of 100° C./cm.

In another embodiment of the above process, a magnetic single domain size MnBi particle composite is obtained which contains about 0.72 to 20.8% by weight Mn (Mn rich off-eutectic) which employs a solidifying rate of 0.5 cm/h to 100 cm/h and a thermal gradient of from 100° to 1000° C./cm.

In another embodiment, the resulting MnBi composite is post-heat treated in a temperature range of from 200° C. to 260° C. for a period of from 1 to 100 hr. under an inert atmosphere. mosphere.

In yet another embodiment, this invention is directed to the Bi-MnBi composite having improved permanent magnet properties comprising single domain size MnBi particles, in aligned array, having a particle size of less than 1 micron and an Mn concentration of up to 50% by atomic fraction, said composite having one ferromagnetic and one ferrimagnetic MnBi phase and the post-heat treated composites thereof.

BRIEF DESCRIPTION OF THE DRAWINGS

FIG. 1 is an equilibrium phase diagram;

FIG. 2 is an ampoule design for directional solidification;

FIG. 3 is temperature profiles observed in the laboratory furnace;

FIG. 4 is the eutectic Bi-MnBi morphology produced by directional solidification;

FIG. 6 is the magnetization per unit volume of dispersed MnBi:

FIG. 7 is a hysteresis curve;

FIG. 8 is the isothermal annealing behavior; and

FIG. 9 is the LTP component intrinsic coercivity as a function of V/O LTP Phase.

DETAILED DESCRIPTION OF THE INVENTION

Figure 5:
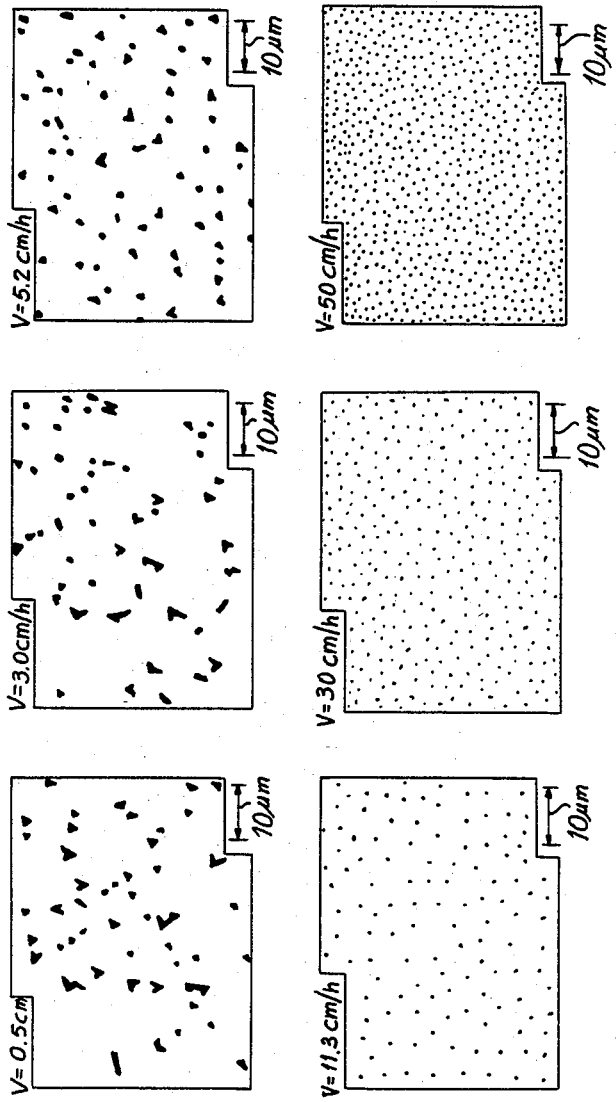
FIG. 5 is the effect of furnace (growth) velocity on MnBi rod size and shape transverse to solidification direction.

The inventive method disclosed herein involves the directional solidification at various growth velocities (0.5 cm/hr to 100 cm/hr) and improved thermal gradients (10° C./cm to 1000° C./cm) of eutectic and Mn rich, off-eutectic Bi-MnBi composites, i.e., aligned MnBi rods in a Bi matrix, resulting in MnBi rods characterized by near theoretical permanent magnet properties after post-heat treatment.

Sample Preparation and Processing

Eutectic (0.72 w/o Mn) and off-eutectic (0.1 to 20.8 w/o Mn) Bi-Mn samples (see FIG. 1) were prepared from commercially pure Mn (99.9 w/o) and high purity Bi (99.999 w/o) using induction melting techniques. Bulk starting composition and uniformity were determined using differential scanning calorimetry and chemical spectrophotometric absorbance. Starting samples, 5.1 cm in length, were encapsulated in evacuated 0.4 cm inner diameter quartz ampoules where the Bi/MnBi sample was localized by means of tight-fitting graphite spacers and quartz wool "0" rings at the appropriate position for solidification as shown in FIG. 2. A melt back interface was additionally used to minimize leak-by of the melt. Each ampoule was instrumented with a single, 0.004 cm bead diameter chromel-alumel thermocouple sheathed in MgO insulation and a 0.025 cm outer diameter stainless steel tube.

The ampoules were then processed in a directional solidification furnace shown schematically in FIG. 3. It is a resistance heated Bridgman-Stockbarger furnace with active cooling in the chill block. Solidification velocity may be varied from 0.1 to 150 cm/hr. The furnace will accept ampoules of the design shown in FIG. 2, and thermal gradients from 10° to 1000° C./cm are readily achieved for the Bi-Mn system.

The plane front directional solidification of eutectic and off-eutectic alloys requires the translation of a thermal gradient along the length of the sample. The ratio of the thermal gradient, G, to the solidification velocity, V, must exceed a critical value of G/V in order to avoid contitutional supercooling and concomitant nucleation ahead of the solidification interface. This is accomplished in the Bridgman-Stockbarger configuration (FIGS. 1 and 3) by longitudinal heat extraction from the hot end (furnace) to the cold end (chill block), thus establishing a thermal gradient that may be translated along the sample. The heat extraction is accomplished such that the lines of heat flux are parallel to the specimen axis at the solidification temperature. This results in a planar solidification isotherm normal to the specimen axis, and hence a planar solidification interface. Controlled directional solidification of Mn-Bi produces an aligned array of chevron-type cross-section shaped MnBi rods, with length to diameter ratios 100, whose average effective rod diameter follows a (growth velocity)$^{-\frac{1}{2}}$ law in thermal gradients varying from 10° C./cm to 1000° C./cm and whose rod diameter can be varied from 0.4 m at V=50 cm/h/ to 10μm at V=0.5 cm/h as shown in FIGS. 4 and 5.

Magnetic Properties

Magnetization, measured parallel and perpendicular to the growth direction as a function of applied field (−230 to 230 kG) at temperatures of 4.2, 77, 295 and 295 to 538 K was used to characterize the magnetic properties.

At room temperature, there is ample experimental evidence for the existence of two ferromagnetic MnBi phases (U.S. Pat. Nos. 3,539,383 and 3,619,289 to Chen et al). One phase, the low-temperature (LTP) or equilibrium MnBi phase has an anisotropy energy which is a monotonically decreasing function below 500K with an expected intrinsic coercivity of 35 kOe for Stoner-Wohlfarth single domain, coherent rotation particles at room temperature. The other, the so-called quenched-high-temperature-phase (QHTP), which stable above 613K, can be represented as $Mn_{1.08}Bi$ where is assumed that 15% of the Mn atoms of the MnBi compound occupy octahedral, interstitial positions in its NiAs structure. Recently, we have observed the existence of a third magnetic phase and termed it the High Coercive Strength or HC phase.

We find that the HC phase is paramagnetic at room temperature and orders ferrimagnetically at 40K with an intrinsic coercivity of 120 kOe at 77K, and with a remanent induction of about 2800 gauss (as shown in FIGS. 6 and 7). The magnitude of the intrinsic coercivity and shape of the demagnetization curve for the HC phase at 77K is suggestive of Stoner-Wohlfarth single domain, coherent rotation particles. The amount of HC phase is a function of growth velocity and thermal gradient. We find more of the HC phase and correspondingly less of the LTP for higher growth velocities and thermal gradients.

The room temperature intrinsic coercivity for samples processed only by directional solidification (which we call the as-grown state) appears to be a weakly dependent function of the average dispersed MnBi particle size except for very high growth velocities where the samples become almost paramagnetic in character, i.e., where almost 100% of the MnBi particles consist of the HC phase. We have seen dramatic improvement at room temperature not only in saturation magnetization and remanent induction but also in intrinsic coercivity and energy product after a 24 hour heat-treatment anneal at 250° C., since the HC phase undergoes conversion to the LTP phase as a function of the heat treatment anneal as shown in FIGS. 6, 7 and 8.

Our results suggest that the coexistence of the HC phase with the LTP phase limits the room temperature intrinsic coercivity of the LTP phase for effective MnBi particle diameters $<D> \leq 2.0$ μm and enhances it for $<D> \geq 3.5$ μm. This behavior is similar to that observed in certain rare earth-cobalt materials in which the introduction of a region of reduced m gnetocrystalline anisotropy (magnetic defect) can either enhance (pinning) or decrease (nucleation of reverse domains) the intrinsic coercivity. We have achieved permanent magnet properties for those MnBi rods containing the LTP phase which are >98% the theoretical maximum. Over the temperature range from −50° C. to +150° C., these permanent magnet figures of merit are competitive with those of the rare earth-cobalt family currently produced by a sintering process.

In addition, we are able to produce the HC phase, unstable above 200° C. but stable below 100° C. with magnetic properties which makes it a superior permanent magnet material for use in cryogenic environments.

We propose producing rods of $(LTP)_{1-x}(HC)_x (0 \leq x \leq 1)$ MnBi rods by directional solidification, varying the amount (volume fraction) of MnBi by either hot-rolling or extruding the directionally solidified (ds) product and forming various forms or shapes whose permanent magnet figures of merit can be optimized for use at room and elevated temperatures (−50° C. to +150° C.) for motor applications (for example) or for use at cryogenic temperatures (<100K) or as a magnetic switch (paramagnetic at T>290K and ferromagnetic for T<100K). This choice of magnetic properties can be achieved by a suitable heat-treatment anneal of the as-grown MnBi rods (i.e., a suitable x in $(LTP)_{1-x}(HC)_x$).

Also, since the cost in materials (50° Mn+50% Bi) in making 1 gram of MnBi is at least one order of magnitude lower than the cost in materials (33% Sm+67% Co) of making 1 gram of of MnBi is at least one order of magnitude lower than the cost in materials (33% Sm+67% Co) of making 1 gram of 1 gram of SmCo$_5$ and in view of the opinion that the overriding cost in mass production is ultimately materials cost limited, the alternative of LTP MnBi rod magnets of equivalent (to sintered SmCo$_5$ or (misch-metal) Co$_5$) permanent magnet performance is attractive.

The choice of a binder material can be a polymer material for HC rod permanent magnets at cryogenic temperatures, LTP rod permanent magnets (−50° C. to +150° C.) or for the magnetic switch $(LTP)_{1-x}(HC)_x$ (for intermediate 0×1) or a compaction of LTP rods for room to elevated temperature regimes.

EXAMPLE

Employing a Bridgman-Stockbarger type directional solidification apparatus whose hot zone is maintained at 460° C., whose cold zone is maintained at 25° C., thus giving rise to a thermal gradient in the liquid melt at the solid-liquid interface of about 100° C./cm. The melt is directionally solidified at a growth velocity (furnace speed) of about 30 cm/h.

Morphology and Magnetic Properties

The above solidification conditions for the eutectic composition (0.72% Mn) results in a compositionally uniform product whose morphology is characterized by an aligned ensemble of MnBi rods whose long axis lies along the solidification direction (direction of heat flow) with an average MnBi rod diameter of 0.5 micron and length to diameter ratio 100.

The magnetic properties in the as grown state (no post-solidification heat treatment) are characterized by a non-equilibrium magnetic phase (high coercivity or HC). This phase is paramagnetic at room temperature (FIG. 6) and orders ferrimagnetically at 240° K in the ordered state, i.e., below 240° K, the saturation magnetization is 220 emu/cm$^3$ and the resistance to demagnetization or intrinsic coercivity is 120 kOe (FIG. 7).

For those samples which are heat treated between 200° and 260° C. for periods of between 1 and 100 hrs. the nonequilibrium HC phase transforms to the equilibrium ferromagnetic LTP MnBi phase or a fully transformed sample, the saturation magnetization is 660 emu/cm$^3$ and the intrinsic coercivity approaches 35 kOe at room temperature (FIGS. 6 and 0).

These values are near the theoretically predicted maximum for equilibrium MnBi.

It should be understood by those skilled in the art that various modifications may be made in the present invention without departing from the spirit and scope thereof as described in the specification and defined in the appended claims.

What is claimed is:

1. A method for producing a permanent magnet, comprising the steps of:
    directionally solidifying a composition containing Mn and Bi in a liquid and MnBi and Bi in a resulting solid composition, said solid composition containing from 0.1 to 50% by atomic fraction Mn at a solidyfing rate of 0.5 cm/hr to 100 cm/hr and at a thermal gradient, in the liquid at the liquid-solid interface, of from 10° C./cm to 1000° C./cm so that there is in the solid an aligned array of magnetic signal domain size MnBi particles;
    post heat treating the solid composition in a temperature range of from 200° C. to 260° C. for a period of from 1 to 100 hours so that the particles have substantially the theoretical maximum remanent induction of 8200 gauss and intrinsic coercivity of 35,000 Oe; and
    increasing volume fraction of the McBi particles in the solid composition to substantially full density by hot rolling or extruding.

2. The method of claim 1, wherein the solid composition contains substantially 0.72% by weight Mn, said solidifying rate is 30 cm/h and said thermal gradient is 100° C./cm.

3. The method of claim 1, wherein the solid composition contains from 0.72 to 20.8% by weight Mn, and said thermal gradient is from 100° C./cm to 1000° C./cm.

4. The method of claim 1, wherein the solid composition contains from 0.11 to 0.72% by weight Mn, and said thermal gradient is from 10° C./cm to 1000° C./cm.

5. The method of claim 1, wherein said post-heat treatment is effected in a vacuum furnace at a pressure of less than $10^{-5}$ Torr. or in an inert atmosphere.

* * * * *